United States Patent
Ikeda

(10) Patent No.: US 10,939,599 B2
(45) Date of Patent: Mar. 2, 2021

(54) COMPONENT-MOUNTING DEVICE

(71) Applicant: Panasonic Intellectual Property Management Co., Ltd., Osaka (JP)

(72) Inventor: Kouji Ikeda, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 186 days.

(21) Appl. No.: 16/098,900

(22) PCT Filed: May 25, 2017

(86) PCT No.: PCT/JP2017/019459
§ 371 (c)(1),
(2) Date: Nov. 5, 2018

(87) PCT Pub. No.: WO2017/212925
PCT Pub. Date: Dec. 14, 2017

(65) Prior Publication Data
US 2019/0166734 A1 May 30, 2019

(30) Foreign Application Priority Data
Jun. 9, 2016 (JP) .............................. JP2016-114945

(51) Int. Cl.
*H05K 13/04* (2006.01)
*H05K 3/34* (2006.01)

(52) U.S. Cl.
CPC ............ *H05K 13/0469* (2013.01); *H05K 3/34* (2013.01); *H05K 13/04* (2013.01); *H05K 13/0419* (2018.08)

(58) Field of Classification Search
CPC ........................ H05K 13/0469; H05K 13/0419
See application file for complete search history.

(56) References Cited

FOREIGN PATENT DOCUMENTS

| JP | 2006-186097 A | | 7/2006 |
|---|---|---|---|
| JP | 2006186097 A | * | 7/2006 |
| JP | 2012-028780 A | | 2/2012 |

OTHER PUBLICATIONS

International Search Report of PCT application No. PCT/JP2017/019459 dated Aug. 8, 2017.

* cited by examiner

*Primary Examiner* — Livius R. Cazan
(74) *Attorney, Agent, or Firm* — Pearne & Gordan LLP

(57) ABSTRACT

A component-mounting device includes a mounting head, a discharging portion, and a paste receiving portion. The mounting head holds a component. The discharging portion applies paste by spraying to the component held by the mounting head. The paste receiving portion is provided on the mounting head and captures paste that has been discharged from the discharging portion and has failed to reach the component.

9 Claims, 7 Drawing Sheets

COMPONENT-MOUNTING DEVICE

This application is a U.S. national stage application of the PCT International Application No. PCT/JP2017/019459 filed on May 25, 2017, which claims the benefit of foreign priority of Japanese Patent Application No. 2016-114945 filed on Jun. 9, 2016, the contents all of which are incorporated herein by reference.

TECHNICAL FIELD

The present disclosure relates to a component-mounting device which mounts an electronic component on a substrate.

BACKGROUND ART

In recent years, in order to enhance the product quality of large-scale components such as a ball grid array (BGA), it has become important to ensure bonding strength including the temporary securement function after components are mounted. Therefore, an electronic component mounting device is used which has the function of supplying an adhesive to the lower surface of an electronic component in the state of being held by a mounting head after the component is retrieved (for example, refer to Patent Literature (PTL) 1). The related art disclosed in this patent literature example shows the configuration of an electronic component mounting device (automatic mounting device) for mounting an electronic component (constituting element) on a substrate, in which a dispenser system having the function of discharging an adhesive (medium for dispensers) against gravity to the lower surface of an electronic component held by a mounting head is used to additionally apply the adhesive.

CITATION LIST

Patent Literature

PTL 1: Unexamined Japanese Patent Publication No. 2012-028780

SUMMARY OF THE INVENTION

The component-mounting device includes a mounting head, a discharging portion, and a paste receiving portion. The mounting head holds a component. The discharging portion applies paste by spraying to the component held by the mounting head. The paste receiving portion is provided on the mounting head and captures paste that has been discharged from the discharging portion and has failed to reach the component.

DESCRIPTION OF EMBODIMENTS

Before the description of the present exemplary embodiment, a problem with a conventional component-mounting device will be briefly described. Upon application of an adhesive, the adhesive needs to be accurately applied to a predetermined position of an electronic component which is an application target. However, the flying direction of the adhesive, the shape of droplets, etc., are not always stable, depending on the properties of the adhesive used, the discharge condition of a dispenser system, and so on. The discharged adhesive takes the form of fine droplets which, aside from main droplets normally flying toward the position of the application target, are scattered in directions offset from the application target. The droplets scattered as just described cause device contamination and damage by adhering to a portion of a mounting head other than the application target, such as a nearby mechanical unit represented by a suction nozzle for holding an electronic component. If such contamination and damage are left, a failure may occur; thus, the task of cleaning off the contamination and damage is required, leading to an increase in load on workers.

Figure 1:
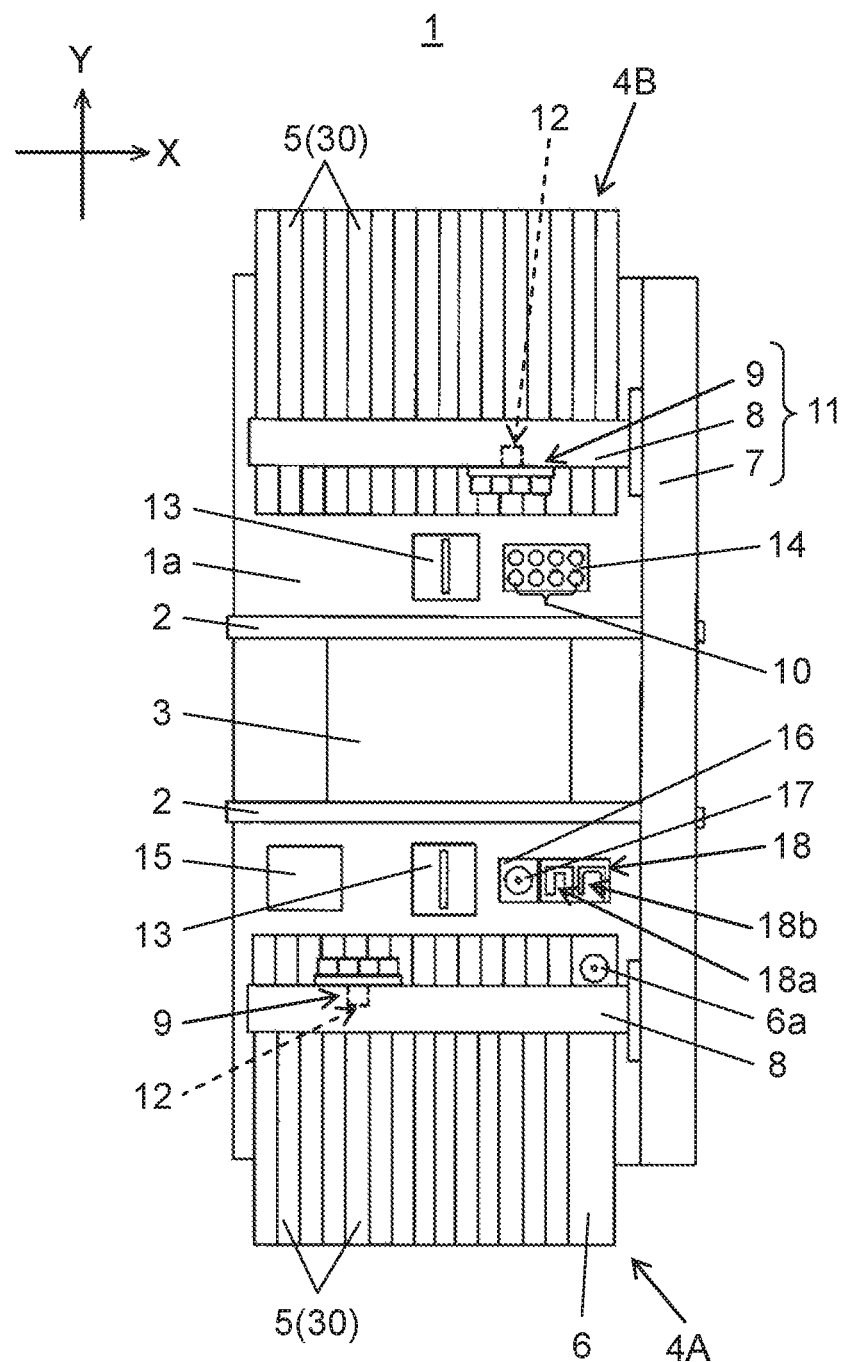
FIG. 1 is a plan view of a component-mounting device according to the present exemplary embodiment.

Next, an exemplary embodiment of the present disclosure will be described with reference to the drawings. First, with reference to FIG. 1, the configuration of component-mounting device 1 will be described. FIG. 1 is a plan view of component-mounting device 1 according to the present exemplary embodiment. Component-mounting device 1 has a function of mounting an electronic component which is the first component held by a mounting head onto a substrate which is the second component.

In FIG. 1, substrate conveyance mechanism 2 is disposed at the center of base 1a along the X axis (substrate conveyance direction). Substrate conveyance mechanism 2 transports substrate 3 which is the second component carried in from the upstream side, and positions and holds substrate 3 on a mounting stage that has been set for performing component-mounting operations. Component supplying portions 4A and 4B are disposed on both sides of substrate conveyance mechanism 2, and each of component supplying portions 4A and 4B includes feeder base 30 having a plurality of slots into which a parts feeder is fitted. One or more tape feeders 5 each of which is the parts feeder are fitted in parallel into the slots of feeder base 30. Note that tape feeder 5 is installed above feeder base 30 (on the drawing sheet side in FIG. 1).

Together with tape feeder 5 for supplying an electronic component which is the first component to component-mounting device 1, disperser unit 6 is fitted into a slot of shared feeder base 30 in component supplying portion 4A on one side (on the lower side in FIG. 1). Tape feeder 5 feeds a carrier tape containing the electronic components in a tape feeding direction at a uniform pitch, thereby supplying the carrier tape to the retrieval position for mounting head 9 of component-mounting mechanism 11 to be described later.

Discharging portion 6a which discharges paste to be applied to the electronic component is disposed at a front end portion, on the side of substrate conveyance mechanism 2, of dispenser unit 6 (unit) fitted to feeder base 30. Discharging portion 6a has a function of applying paste P such as adhesive for bonding components by spraying to the electronic component held by mounting head 9 (refer to FIG. 4A). Specifically, discharging portion 6a includes: a paste reservoir, such as a syringe, which stores paste P; and a discharging mechanism which discharges paste P fed from the paste reservoir. The operation of this discharging mechanism causes paste P to fly against gravity through discharging hole 6b upwardly disposed in discharging portion 6a; in this way, paste P reaching electronic component 19 (refer to FIG. 4A), which is an application target, from below is applied thereto. In this example, dispenser unit 6 is disposed on only component supplying portion 4A (refer to FIG. 1) on one side, but the same or similar configuration may be applied to component supplying portion 4B on the other side.

Y-axis table mechanism 7 including a linear drive mechanism is disposed along the Y axis (direction orthogonal to the X-axis direction) at an end portion of the upper surface of base 1a on one side along the X axis, and two X-axis table mechanisms 8 each including a linear drive mechanism likewise are connected to Y-axis table mechanism 7 in such a way as to be movable along the Y axis. Mounting head 9 is fitted on each of two X-axis table mechanisms 8 in such a way as to be movable along the X axis.

Figure 4A:
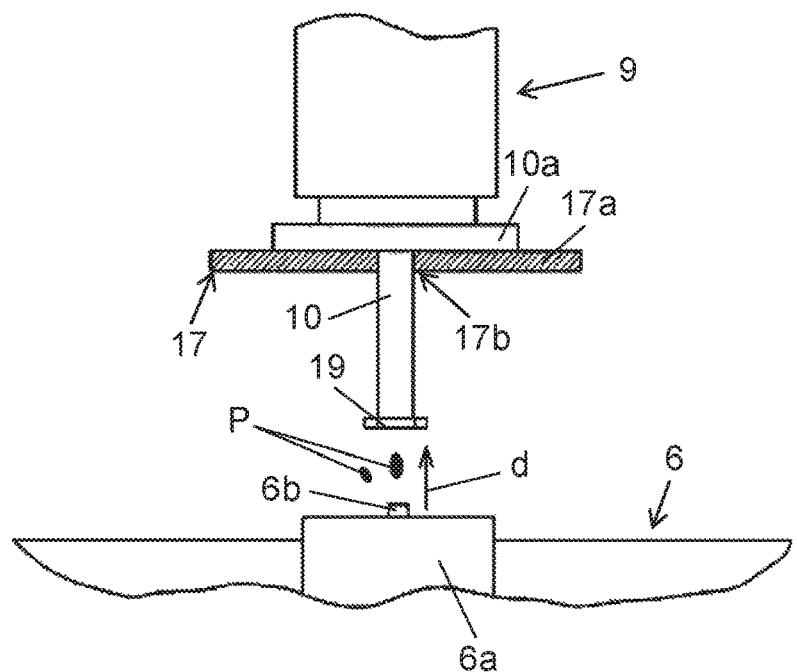
FIG. 4A illustrates application of paste in a component-mounting device according to the present exemplary embodiment.

Mounting head 9 is a multiple-composite head including a plurality of holding heads, and suction nozzle 10 capable of sucking, holding, and individually moving up and down electronic component 19 is fitted on a lower end portion of each of the holding heads (refer to FIG. 4A). Mounting head 9 includes: a Z-axis raising and lowering mechanism which moves up and down suction nozzle 10; and a θ-axis rotation mechanism which rotates suction nozzle 10 about the nozzle axis.

When Y-axis table mechanism 7 and X-axis table mechanism 8 are driven, mounting head 9 moves along the X axis and the Y axis. Thus, each of two mounting heads 9 retrieves an electronic component by suction nozzle 10 from the retrieval position of tape feeder 5 of a corresponding one of component supplying portions 4A and 4B. In the present exemplary embodiment, mounting head 9 has a function of holding not only electronic component 19 supplied by tape feeder 5, but also anti-scattering cover 17 to be described later, for a predetermined operation or process such as transfer.

Component recognition camera 13, waste box 15, anti-scattering cover supplying portion 16, and anti-scattering cover attaching/detaching portion 18 are disposed between component supplying portion 4A on one side and substrate conveyance mechanism 2, and component recognition camera 13 and nozzle holder 14 are disposed between component supplying portion 4B on the upper side and substrate conveyance mechanism 2. Anti-scattering cover supplying portion 16 has a function of causing a plurality of disc-shaped anti-scattering covers 17, which is to be provided on mounting head 9, to be stacked and supplied (refer to FIG. 3A).

Anti-scattering cover 17 is attached to an upper portion of suction nozzle 10 in mounting head 9, functions as a paste receiving portion which captures paste P that has been discharged from discharging portion 6a and has failed to reach electronic component 19 which is an application target, and is configured to be detachably attached to mounting head 9. Anti-scattering cover supplying portion 16 which causes anti-scattering covers 17 to be stacked and supplied serves as a paste receiving portion supplying portion which supplies a plurality of paste receiving portions. Anti-scattering cover attaching/detaching portion 18 serves as a paste receiving portion attaching/detaching portion which causes anti-scattering cover 17 serving as a paste receiving portion to be attached to and detached from mounting head 9.

Nozzle holder 14 accommodates a plurality of suction nozzles to be fitted onto mounting head 9. Mounting head 9 is moved to access nozzle holder 14 where a predetermined nozzle replacement operation is performed; in this way, suction nozzle 10 corresponding to a target to be held is fitted onto mounting head 9. Waste box 15 recovers electronic component 19 determined as defective in the recognition result of the outcome of imaging with component recognition camera 13, anti-scattering cover 17 after use, and so on. Specifically, mounting head 9 holding electronic component 19, anti-scattering cover 17, etc., to be recovered is moved to waste box 15, and a discarding operation is performed; in this way, the target to be recovered is discarded into waste box 15 and recovered.

At the time when mounting head 9 that has retrieved electronic component 19 from component supplying portion 4A or 4B moves above component recognition camera 13, component recognition camera 13 captures an image of electronic component 19 in the state of being held by mounting head 9. Through a recognition process on the result of this imaging, electronic component 19 is identified or located. Substrate recognition camera 12 which is located on the side of the lower surface of X-axis table mechanism 8 and integrally moves with mounting head 9 is fitted on mounting head 9. As mounting head 9 moves, substrate recognition camera 12 moves to a position above substrate 3 positioned by substrate conveyance mechanism 2 and captures an image of substrate 3. The position of substrate 3 is detected through the recognition process on the result of this imaging.

Figure 2:
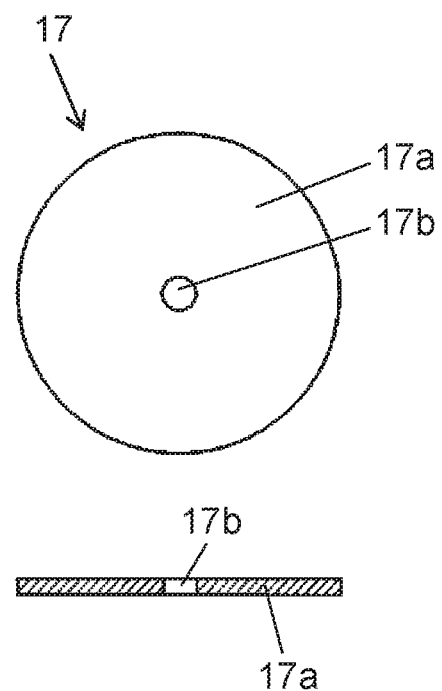
FIG. 2 illustrates the configuration of an anti-scattering cover used in a component-mounting device according to the present exemplary embodiment.

FIG. 2 illustrates the configuration of anti-scattering cover 17 used in component-mounting device 1 according to the present exemplary embodiment. As illustrated in FIG. 2, anti-scattering cover 17 (Example 1) has fitting hole 17b having a diameter slightly smaller than the outer diameter of suction nozzle 10 in a central area of main body portion 17a formed into a disc shape using a disposable material as a consumable component, such as resin. As described earlier, mounting head 9 includes suction nozzle 10, and anti-scattering cover 17 serving as the paste receiving portion has fitting hole 17b in the central area. Upon attaching anti-scattering cover 17 to mounting head 9, suction nozzle 10 is inserted into fitting hole 17b so that main body portion 17a is held by suction nozzle 10 by pressure; in this way, anti-scattering cover 17 is attached to suction nozzle 10.

Figure 3A:
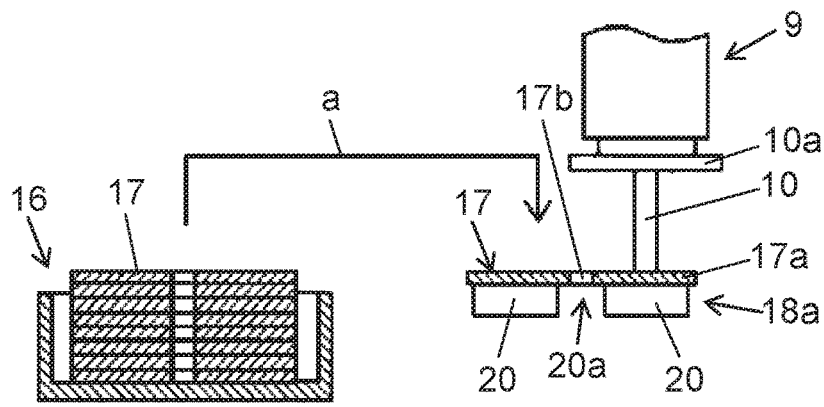
FIG. 3A illustrates the operation of attaching an anti-scattering cover in a component-mounting device according to the present exemplary embodiment.

FIG. 3A to FIG. 3D illustrate the operation of attaching anti-scattering cover 17 in component-mounting device 1 according to the present exemplary embodiment. Fitting unit 18a disposed in anti-scattering cover attaching/detaching portion 18 is used for the aforementioned attachment of anti-scattering cover 17 to mounting head 9. Specifically, as illustrated in FIG. 3A, the main body of fitting unit 18a is fitting tool 20 having a rough U-shape in plan view. Fitting tool 20 has opening 20a shaped and sized to allow passage of suction nozzle 10 fitted on mounting head 9 while blocking passage of flanged portion 10a integrally provided with suction nozzle 10.

Upon attaching anti-scattering cover 17 to mounting head 9 using fitting unit 18a, first, suction nozzle 10 of mounting head 9 retrieves, by sucking and holding main body portion 17a, anti-scattering cover 17 stacked in anti-scattering cover supplying portion 16, as illustrated in FIG. 3A. Next, mounting head 9 holding anti-scattering cover 17 is moved to fitting unit 18a, and anti-scattering cover 17 being held is positioned so that fitting hole 17b is located above opening 20a and then placed on the upper surface of fitting tool 20 (arrow a).

Figure 3B:
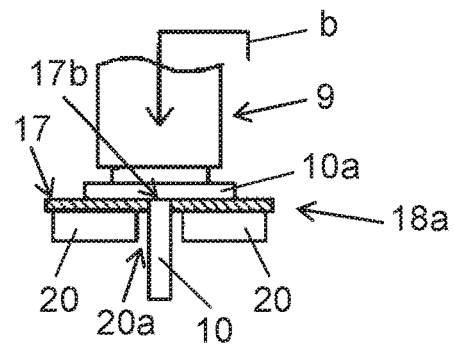
FIG. 3B illustrates the operation of attaching an anti-scattering cover in a component-mounting device according to the present exemplary embodiment.

Next, as illustrated in FIG. 3B, in the state where anti-scattering cover 17 no longer sucked by suction nozzle 10 stays on the upper surface of fitting tool 20, mounting head 9 is moved so that suction nozzle 10 is pressed into fitting hole 17b, and mounting head 9 is lowered to a position in which flanged portion 10a abuts main body portion 17a (arrow b). In this way, anti-scattering cover 17 is held by suction nozzle 10 by pressure via fitting hole 17b.

Figure 3C:
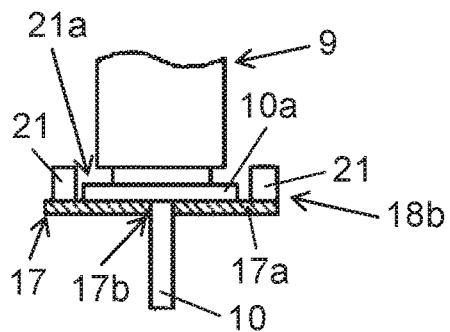
FIG. 3C illustrates the operation of attaching an anti-scattering cover in a component-mounting device according to the present exemplary embodiment.

Upon detaching anti-scattering cover 17 attached to mounting head 19, removal unit 18b disposed on anti-scattering cover attaching/detaching portion 18 is used. Specifically, as illustrated in FIG. 3C, the main body of removal unit 18b is removal tool 21 having a rough U-shape in plan view. Removal tool 21 has opening 21a shaped and sized to allow passage of flanged portion 10a integrally provided with suction nozzle 10 while blocking passage of anti-scattering cover 17.

Upon detaching anti-scattering cover 17 attached to mounting head 9 using removal unit 18b, first, mounting head 9 with anti-scattering cover 17 attached to suction nozzle 10 is moved, the height thereof is adjusted so that main body portion 17a is located on the side of the lower surface of removal tool 21, and in this state, flanged portion 10a is moved into opening 21a, as illustrated in FIG. 3C. By raising mounting head 9 in this state, main body portion 17a in the state of being attached to suction nozzle 10 abuts the lower surface of removal tool 21.

Figure 3D:
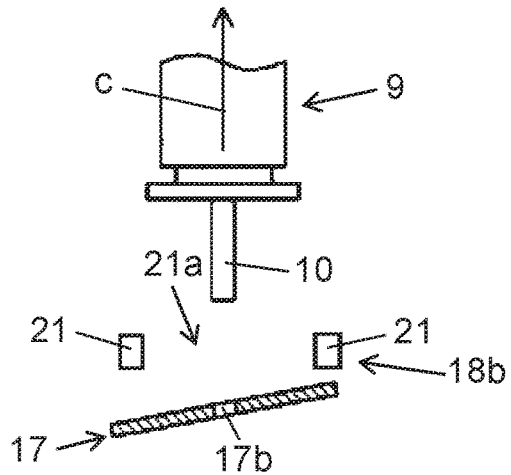
FIG. 3D illustrates the operation of attaching an anti-scattering cover in a component-mounting device according to the present exemplary embodiment.

Next, as illustrated in FIG. 3D, mounting head 9 is raised further (arrow c), and thus suction nozzle 10 is raised together with mounting head 9 in the state where anti-scattering cover 17 is in engagement with removal tool 21. Consequently, suction nozzle 10 is pulled out of fitting hole 17b, and anti-scattering cover 17 is detached from suction nozzle 10, falls down, and is recovered.

Next, with reference to FIG. 4A, the functions of anti-scattering cover 17 will be described. FIG. 4A illustrates the operation of applying paste P in component-mounting device 1 according to the present exemplary embodiment. FIG. 4A shows the state where electronic component 19 retrieved by suction nozzle 10 from tape feeder 5 is positioned above discharging portion 6a of dispenser unit 6.

Anti-scattering cover 17 has been attached to mounting head 9 in advance, and main body portion 17a held by suction nozzle 10 being pressed into fitting hole 17b protrudes further outward than flanged portion 10a integrally formed with suction nozzle 10.

In the operation of applying paste P to electronic component 19, discharging portion 6a of dispenser unit 6 is operated to spray main droplets of paste P toward the lower surface of electronic component 19 through discharging hole 6b (arrow d), thereby causing the main droplets to reach a predetermined target application position. At this time, paste P discharged through discharging hole 6b of discharging portion 6a includes, aside from the main droplets which reach the target application position by normally flying thereto, paste P in particle form that scatter while diffusing upward. Such paste P in particle form that has failed to reach electronic component 19 is captured by adhering to the lower surface of main body portion 17a due to anti-scattering cover 17 having been attached to suction nozzle 10. Thus, it is possible to prevent paste P discharged from discharging portion 6a from scattering and adhering, thereby causing contamination or damage, to a portion other than the application target, for example, a lower mechanical portion of mounting head 9.

Figure 4B:
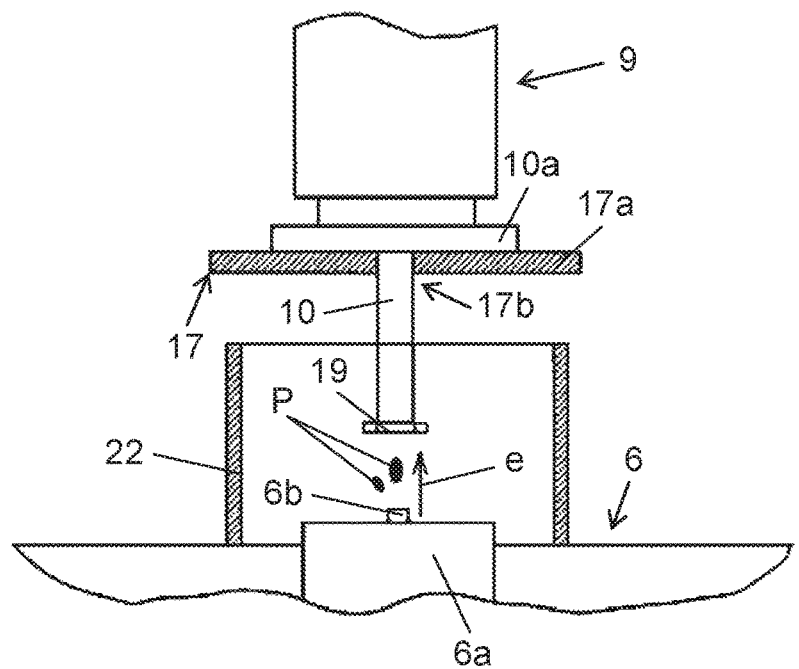
FIG. 4B illustrates application of paste in a component-mounting device according to the present exemplary embodiment.

FIG. 4B illustrates an example in which, in addition to anti-scattering cover 17 described above, anti-scattering wall 22 which prevents discharged paste P from scattering around is disposed surrounding discharging hole 6b of discharging portion 6a. Anti-scattering wall 22 is a cylindrical member somewhat smaller in diameter than main body portion 17a of anti-scattering cover 17. As a result of providing such anti-scattering wall 22, upon spraying the main droplets of paste P toward the lower surface of electronic component 19 through discharging hole 6b (arrow e), even when the particles of paste P are scattered over such a wide range that cannot be covered by anti-scattering cover 17, it is possible to capture scattering paste P by adhesion to the inner surface of anti-scattering wall 22.

Figure 5A:
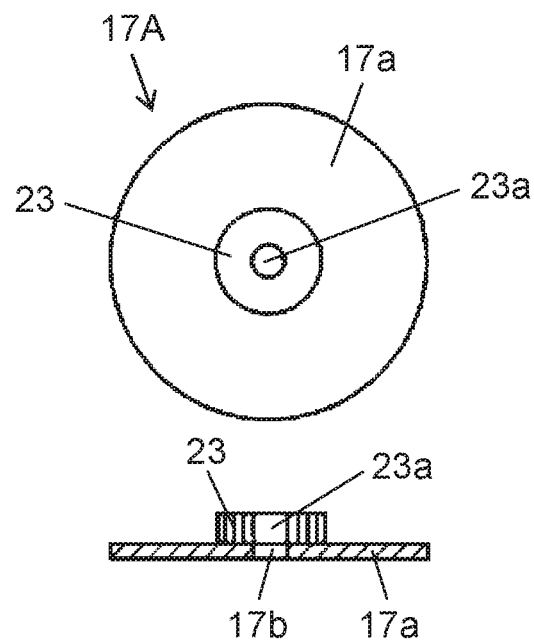
FIG. 5A illustrates the configuration of another anti-scattering cover used in a component-mounting device according to the present exemplary embodiment.
Figure 5B:
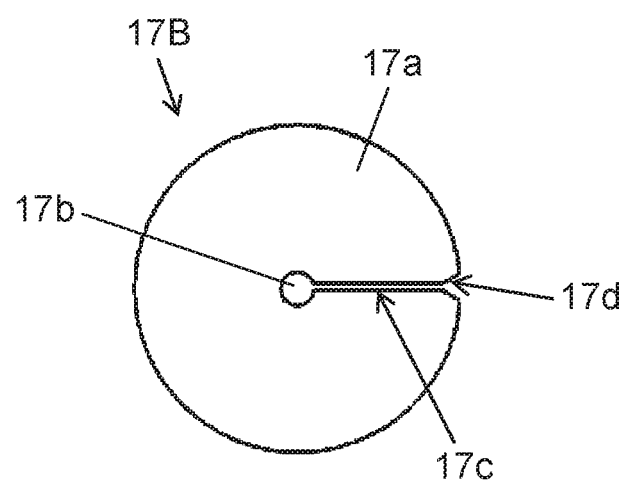
FIG. 5B illustrates the configuration of another anti-scattering cover used in a component-mounting device according to the present exemplary embodiment.

Note that FIG. 5A and FIG. 5B exemplify variations of anti-scattering cover 17 to be used in such applications. First, anti-scattering cover 17A (Example 2) illustrated in FIG. 5A is provided by providing, on anti-scattering cover 17 illustrated in FIG. 2, elastic holding portion 23 which is a ring-shaped elastic member having fitting hole 23a around fitting hole 17b. A stretchable material such as rubber is used for elastic holding portion 23, and the inner diameter of fitting hole 23a is set somewhat smaller than the outer diameter of corresponding suction nozzle 10. Upon attaching anti-scattering cover 17A to suction nozzle 10, suction nozzle 10 is pressed into fitting hole 23a, as in the method illustrated in FIG. 3A. As a result of such elastic holding portion 23 being included in anti-scattering cover 17A, anti-scattering cover 17A can be securely held on suction nozzle 10.

Next, anti-scattering cover 17B (Example 3) illustrated in FIG. 5B is provided by forming, in anti-scattering cover 17 illustrated in FIG. 2, cutout 17c serving as a guide for introducing suction nozzle 10 into fitting hole 17b. Specifically, anti-scattering cover 17B has cutout 17c formed extending continuously from the edge of main body portion 17a to fitting hole 17b and further has cutout opening 17d which is cutout 17c open at the edge. Upon attaching anti-scattering cover 17B having such a configuration to suction nozzle 10, the outer peripheral surface of suction nozzle 10 is slid into cutout 17c via cutout opening 17d and guided to fitting hole 17b; in this way, anti-scattering cover 17B is attached to suction nozzle 10. Note that cutout 17c may be a slit formed by removing a portion having a predetermined cut width along a cutout line extending from fitting hole 17b to the edge.

Figure 6A:
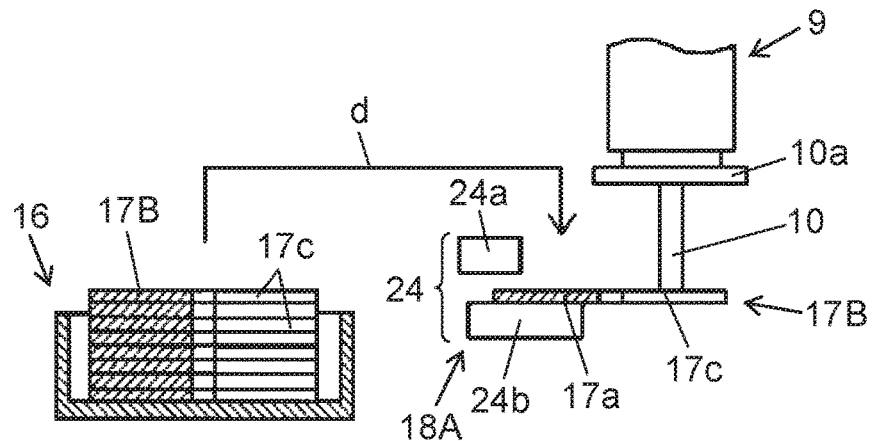
FIG. 6A illustrates the operation of attaching an anti-scattering cover in a component-mounting device according to the present exemplary embodiment.
Figure 6B:
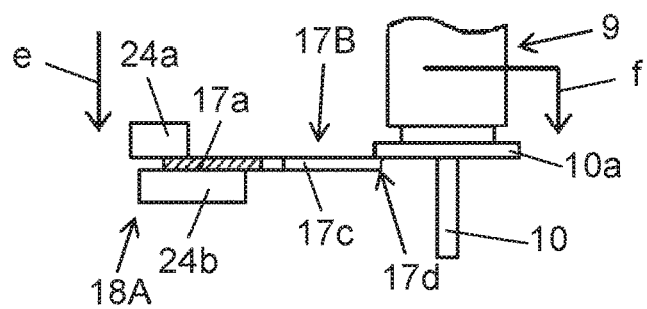
FIG. 6B illustrates the operation of attaching an anti-scattering cover in a component-mounting device according to the present exemplary embodiment.
Figure 6C:
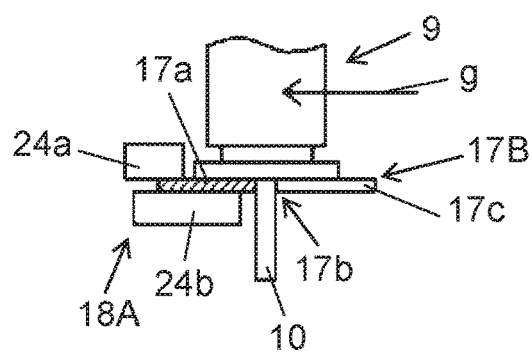
FIG. 6C illustrates the operation of attaching an anti-scattering cover in a component-mounting device according to the present exemplary embodiment.

FIG. 6A to FIG. 6C illustrate the operation of attaching anti-scattering cover 17B to suction nozzle 10. Here, anti-scattering cover attaching/detaching portion 18A is used which includes clamping unit 24 capable of clamping anti-scattering cover 17B by two clamping members, namely, upper member 24a and lower member 24b. Specifically, clamping unit 24 is configured by combining upper member 24a capable of rising and lowering from above with lower member 24b provided in such a manner as to be able to support, on the upper surface, one end of anti-scattering cover 17B from the below. Upper member 24a is of a shape that does not interfere with flanged portion 10a to allow lateral access of mounting head 9 fitted with suction nozzle 10 in the state where anti-scattering cover 17B is clamped by clamping unit 24.

Upon attaching anti-scattering cover 17B to suction nozzle 10 using anti-scattering cover attaching/detaching portion 18A, first, suction nozzle 10 of mounting head 9 retrieves, by sucking and holding main body portion 17a, anti-scattering cover 17B stacked in anti-scattering cover supplying portion 16, as illustrated in FIG. 6A. At this time, in anti-scattering cover supplying portion 16, anti-scattering cover 17B has been positioned so that cutout 17c illustrated in FIG. 5B is located in a predetermined direction. Next, mounting head 9 holding anti-scattering cover 17B is moved to anti-scattering cover attaching/detaching portion 18A, and one end of main body portion 17a of anti-scattering cover 17B being held is placed on the upper surface of lower member 24b (arrow d). At this time, anti-scattering cover 17B is positioned so that cutout 17c is located in a predetermined direction suitable for introducing suction nozzle 10.

Next, as illustrated in FIG. 6B, upper member 24a is lowered (arrow e), and anti-scattering cover 17B is clamped by clamping unit 24. Subsequently, in this state, main body portion 17a sucked and held by suction nozzle 10 is released, then mounting head 9 is moved, and the operation of attaching anti-scattering cover 17B to suction nozzle 10 is performed. Specifically, mounting head 9 is moved (arrow f) so that flanged portion 10a is located at the same height as the upper surface of main body portion 17a and suction nozzle 10 is located in a direction corresponding to cutout opening 17d for cutout 17c formed in anti-scattering cover 17B.

Next, as illustrated in FIG. 6C, mounting head 9 is horizontally moved (arrow g) so that suction nozzle 10 moves into cutout 17c via cutout opening 17d and reaches fitting hole 17b by being guided by cutout 17c. Accordingly, suction nozzle 10 is placed in the state of being secured in fitting hole 17b by pressure. Subsequently, the clamping of anti-scattering cover 17B by clamping unit 24 is released by raising upper member 24a, and thus attachment of anti-scattering cover 171B to suction nozzle 10 is completed. Note that upon detaching anti-scattering cover 17B attached to suction nozzle 10, suction nozzle 10 held in fitting hole 17b can be detached along cutout 17c by performing, in the opposite order, the operation illustrated in FIG. 6A to FIG. 6C.

Figure 7:
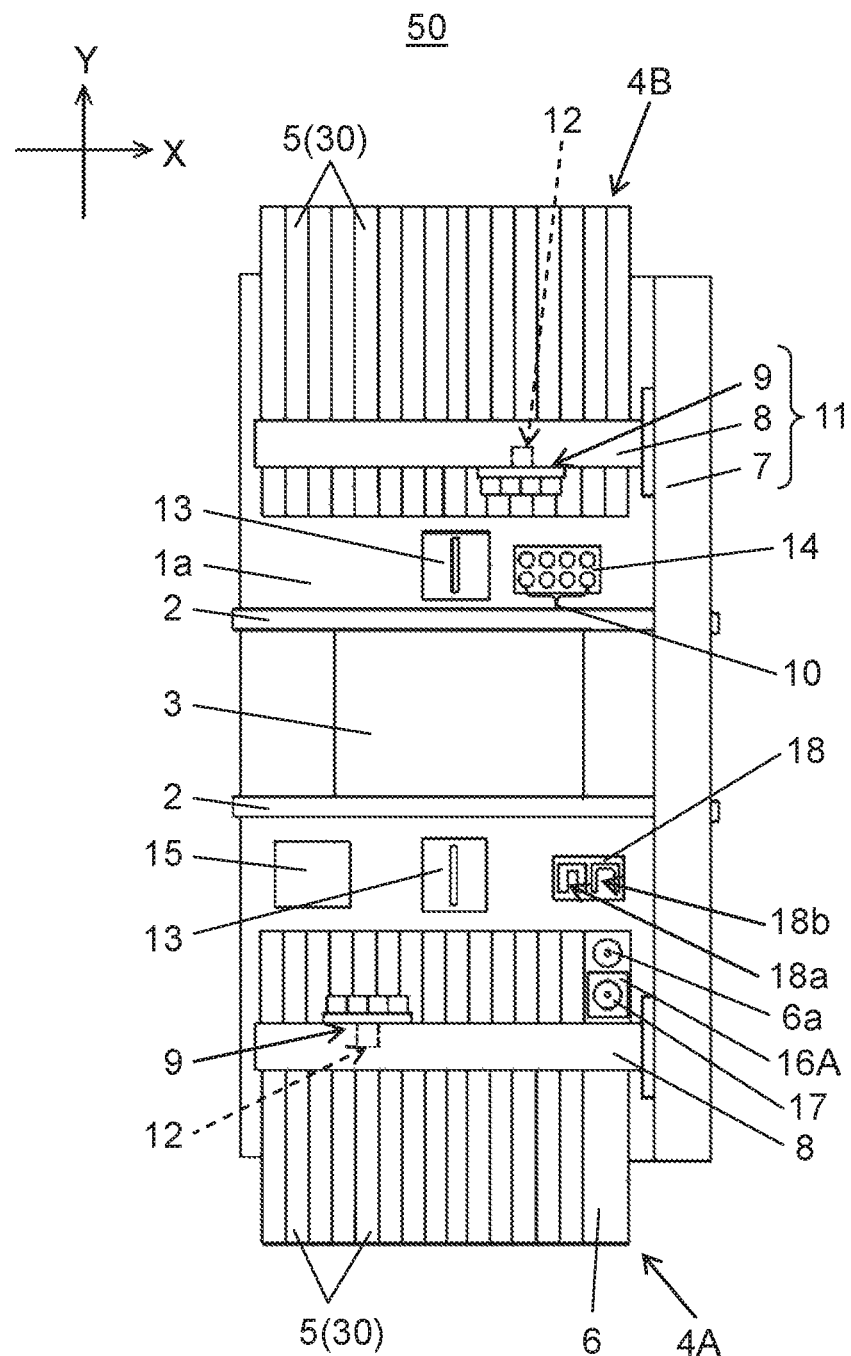
FIG. 7 is a plan view of another component-mounting device according to the present exemplary embodiment.

FIG. 7 is a plan view of another component-mounting device 50 according to the present exemplary embodiment. FIG. 7 illustrates an example in which anti-scattering cover supplying portion 16 disposed between substrate conveyance mechanism 2 and component supplying portion 4A in Example illustrated in FIG. 1 is incorporated into dispenser unit 6 which is fitted to feeder base 30 disposed in component supplying portion 4A. In other words, as illustrated in FIG. 7, anti-scattering cover supplying portion 16A having the same or similar configuration as anti-scattering cover supplying portion 16 illustrated in FIG. 1 (also refer to FIG. 3) is disposed near discharging portion 6a disposed on dispenser unit 6. In this Example, the paste receiving portion supplying portion is disposed on dispenser unit 6 (unit) which is fitted to feeder base 30 disposed in component supplying portion 4A.

As described above, the component-mounting device according to the present exemplary embodiment is a component-mounting device for mounting, onto substrate 3 which is the second component, electronic component 19 which is the first component held by mounting head 9, and includes discharging portion 6a which applies paste P by spraying to electronic component 19 held by mounting head 9. Furthermore, the component-mounting device is configured such that anti-scattering cover 17 serving as a paste receiving portion which captures paste P that has been discharged from discharging portion 6a and has failed to reach electronic component 19 is provided on mounting head 9. Thus, upon applying paste to an electronic component, it is possible to prevent the discharged paste from scattering and adhering to a portion other than an application target.

Note that in the examples given in the exemplary embodiment described above, suction nozzle 10 of the vacuum suction type is used as means for holding electronic component 19 by mounting head 9. However, the present invention is also applicable to a method in which electronic component 19 is held by means other than the vacuum suction, for example, a method in which an electronic component is mechanically gripped by a mechanical chuck.

According to the present disclosure, upon additionally applying paste to the lower surface of an electronic component, it is possible to prevent the discharged paste from scattering and adhering to a portion other than an application target.

INDUSTRIAL APPLICABILITY

The component-mounting device according to the present disclosure produces the advantageous effect of being able to prevent, upon applying paste to an electronic component, the discharged paste from scattering and adhering to a portion other than an application target, and thus is useful in the field of component mounting in which paste is additionally applied to the lower surface of an electronic component before mounting onto a substrate.

REFERENCE MARKS IN THE DRAWINGS 1, 50 component-mounting device
1a base
2 substrate conveyance mechanism
3 substrate (second component)
4A, 4B component supplying portion
5 tape feeder (parts feeder)
6 dispenser unit (unit)
6a discharging portion
6b discharging hold
7 Y-axis table mechanism
8 X-axis table mechanism
9 mounting head
10 suction nozzle
10a flanged portion 11 component-mounting mechanism
12 substrate recognition camera
13 component recognition camera
14 nozzle holder
15 waste box
16, 16A anti-scattering cover supplying portion (paste receiving portion supplying portion)
17, 17A, 17B anti-scattering cover (paste receiving portion)
17a main body portion
17b fitting hole
17c cutout
17d opening
18 anti-scattering cover attaching/detaching portion (paste receiving portion attaching/detaching portion)
18A anti-scattering cover attaching/detaching portion
18a fitting unit
18b unit
19 electronic component (first component)
20 fitting tool
20a opening
21 tool
21a opening
22 anti-scattering wall
23 elastic holding portion
23a fitting hole
24 clamping unit
24a upper member
24b lower member
30 feeder base
a arrow
b arrow
c arrow
d arrow
e arrow
f arrow
g arrow
P paste

The invention claimed is:

1. A component-mounting device comprising:
a mounting head which holds a component and includes a suction nozzle;
a discharging portion which applies paste by spraying to the component held by the mounting head; and
a paste receiving portion which is attached to the suction nozzle in the mounting head and captures the paste that has been discharged from the discharging portion and has failed to reach the component.

2. The component-mounting device according to claim 1, wherein
the paste receiving portion is detachably attached to the mounting head.

3. The component-mounting device according to claim 1, wherein
the suction nozzle sucks and holds the component,
a fitting hole is formed in a central area of the paste receiving portion, and
the paste receiving portion is attached to the suction nozzle by insertion of the suction nozzle into the fitting hole.

4. The component-mounting device according to claim 3, wherein
the paste receiving portion includes a ring-shaped elastic member around the fitting hole.

5. The component-mounting device according to claim 3, wherein
one of a cutout and a slit is formed in the fitting hole, the cutout and the slit extending from an edge of the paste receiving portion, and
an outer peripheral surface of the suction nozzle is slid into the one of the cutout and the slit to attach the paste receiving portion to the suction nozzle.

6. The component-mounting device according to claim 1, wherein
the paste receiving portion is one of a plurality of paste receiving portions, and
the component-mounting device further comprises:
a paste receiving portion supplying portion which supplies the plurality of paste receiving portions; and
a paste receiving portion attaching/detaching portion which attaches the paste receiving portion to the mounting head and detaches the paste receiving portion from the mounting head.

7. The component-mounting device according to claim 6, further comprising:
a parts feeder which supplies the component; and
a feeder base having a plurality of slots into each of which the parts feeder is fitted, wherein
the discharging portion is disposed on a unit which is fitted to the feeder base.

8. The component-mounting device according to claim 7, wherein
the paste receiving portion supplying portion is disposed on the unit.

9. The component-mounting device according to claim 1, further comprising:
an anti-scattering wall which is disposed around a discharging hole of the discharging portion and prevents discharged paste from scattering around.

* * * * *